United States Patent [19]
Miyaguchi

[11] Patent Number: 5,600,582
[45] Date of Patent: Feb. 4, 1997

[54] PROGRAMMABLE HORIZONTAL LINE FILTER IMPLEMENTED WITH SYNCHRONOUS VECTOR PROCESSOR

[75] Inventor: Hiroshi Miyaguchi, Tokyo, Japan

[73] Assignee: Texas Instruments Incorporated, Dallas, Tex.

[21] Appl. No.: 222,775

[22] Filed: Apr. 5, 1994

[51] Int. Cl.$^6$ ...................................................... G06F 15/31
[52] U.S. Cl. ................... 364/724.01; 364/724.1
[58] Field of Search .................... 364/724.01, 724.16, 364/736, 754, 724.1

[56] References Cited

U.S. PATENT DOCUMENTS

| | | | |
|---|---|---|---|
| 3,997,772 | 12/1976 | Crochiere et al. | 364/724.1 |
| 3,997,773 | 12/1976 | Van Essen et al. | 364/724.1 X |
| 4,472,785 | 9/1984 | Kasuga | 364/724.1 X |
| 4,748,578 | 5/1988 | Lagadec et al. | 364/724.1 |
| 4,872,133 | 10/1989 | Leeland | 364/748 |
| 5,163,120 | 11/1992 | Childers et al. | 395/800 |
| 5,210,705 | 5/1993 | Chauvel et al. | 364/572 |
| 5,311,459 | 5/1994 | D'Luna et al. | 364/724.16 |

OTHER PUBLICATIONS

R. E. Crochiere and L. R. Rabiner, "Interpolation and Decimation of Digial Signals: A Tutorial Review", Proc. IEEE, vol. 69, pp. 300–331, Mar. 1981.

A. B. Oppenheim and R. W. Schafer, "Discrete–Time Signal Processing", Englewood Cliffs, N.J.: Prentice Hall, 1989, pp. 105–111.

D. S. K. Chan and L. R. Rabiner, "Analysis of Quantization Errors in the Direct Form for Finite Impulse Response Digital Filters", *IEEE Transactions on Audio and Electroacoustics*, vol. ASSP–29, pp. 155–162, Apr. 1981.

E. G. Hogenauer, "An Economical Class of Digital Filters for Decimation and Interpolation", *IEEE Trans. Acoust. Speech, Signal Processing*, vol. ASSP–29, pp. 155–162, Apr. 1981.

T. W. Wong and R. M. Gray, "FIR Filters with Sigma–Delta Modulation Encoding", *IEEE Trans. on Acoust., Speech and Signal Processing*, vol. 38, pp. 979–990, Jun. 1990.

*Primary Examiner*—Tan V. Mai
*Attorney, Agent, or Firm*—Robert D. Marshall, Jr.; James C. Kesterson; Richard L. Donaldson

[57] ABSTRACT

A synchronous vector processor (SVP) (30) is provided to realize a horizontal decimation filter by processing in input value through a plurality of parallel processing elements (40). A plurality of input pixel values (80) representing a horizontal line of information in a video display are input to a data input register (DIR) (31) of the SVP (30). Each of the processing elements (40) is associated with a filter output and is operable to perform all calculations necessary to realize a multi-tap filter structure for the associated output. This is achieved by first increasing the frequency of the input signal by inserting zeros therein and then performing a number of multiplications and additions to generate an output value for that processing element, this realizing an interpolation FIR filter algorithm. The finite impulse response (FIR) filter algorithm is defined by predetermined filter coefficients stored in a constant generator (71d). Each of the processing elements are utilized to multiply a plurality of near-neighbor input values with FIR filter coefficients that are obtained from a constant generator (71d). The resulting sum for each of the processing elements is then input to the a data output register (DOR) (16) as the filter output. The output of the SVP (30) is then input to line memory (90) that is operable to decimate the output of select ones of the processing elements of the SVP (30). This rearranges the outputs to decrease the number of output pixels for each line relative to the number of input pixels for each line.

8 Claims, 8 Drawing Sheets

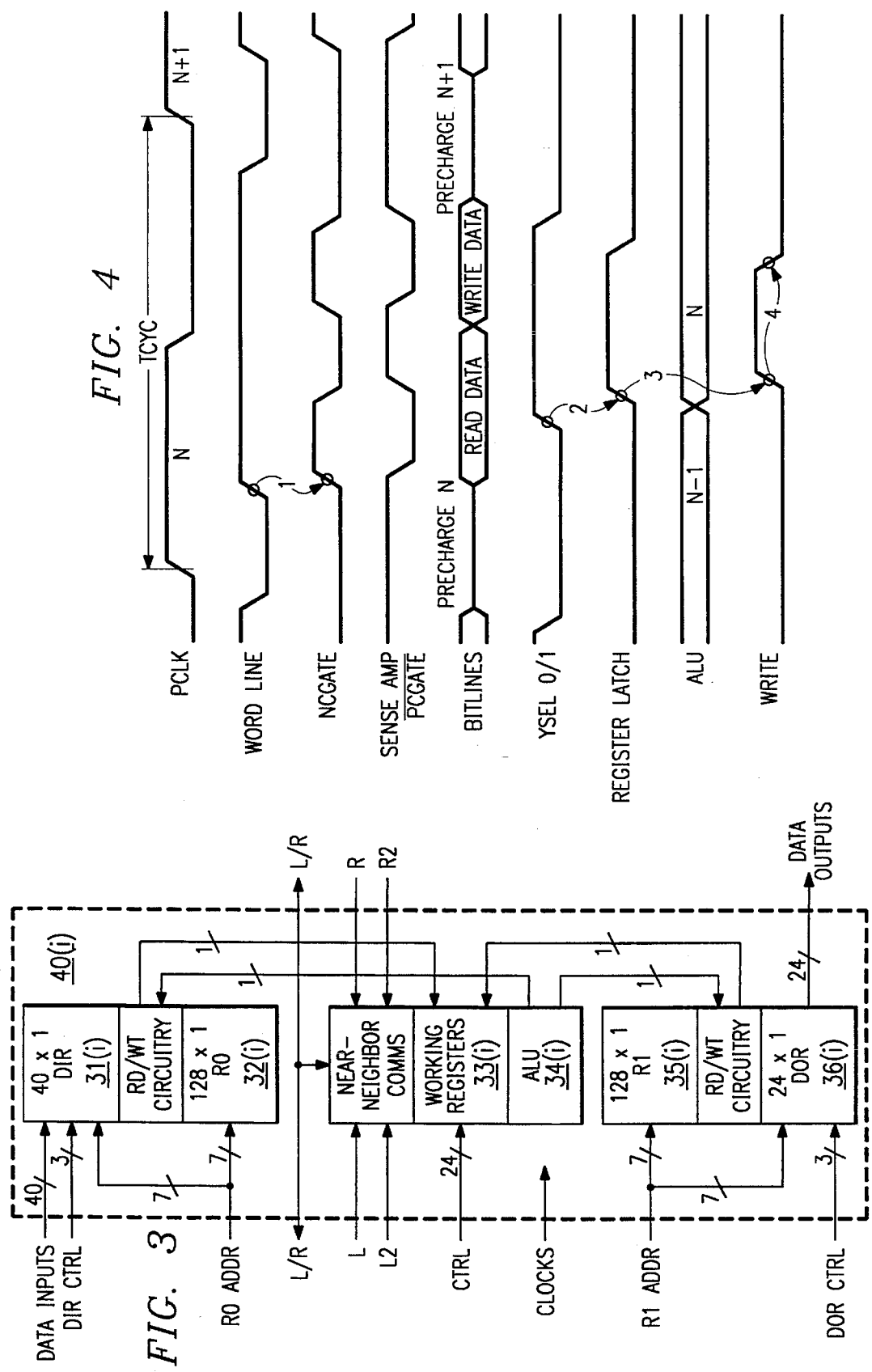

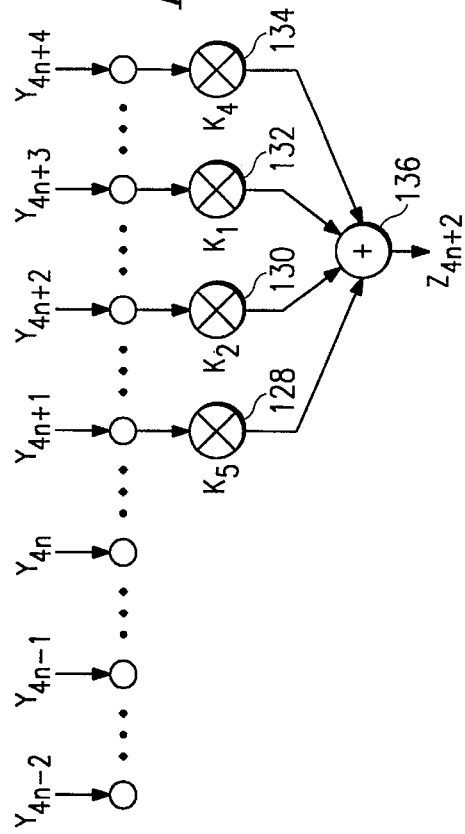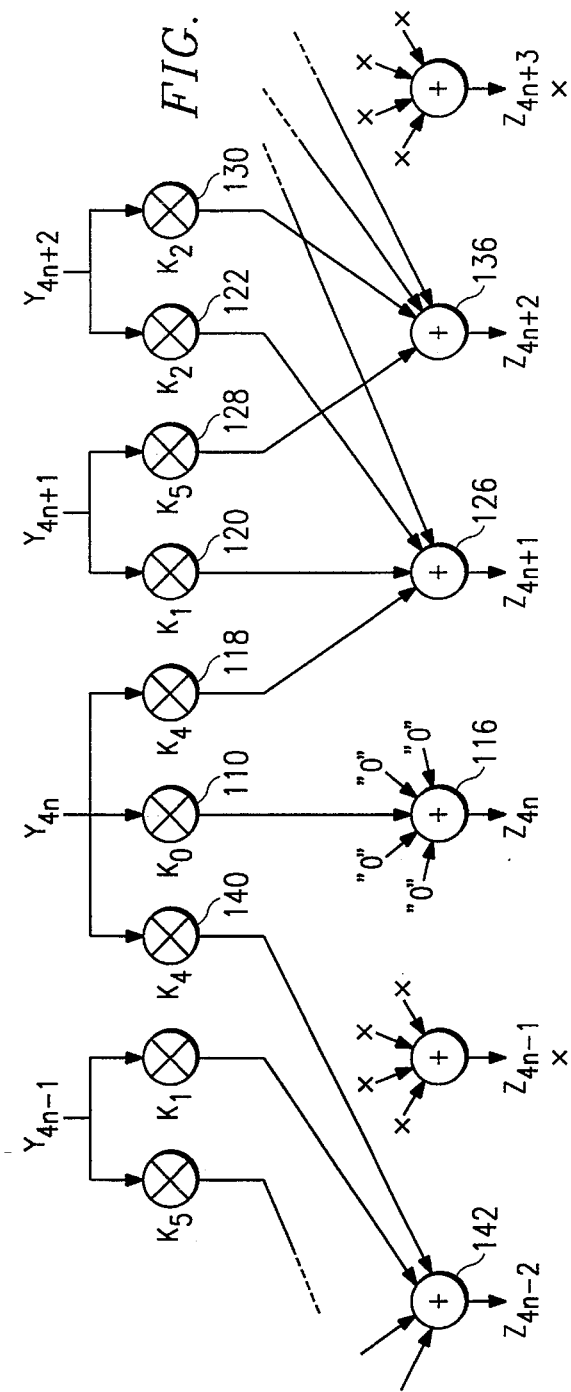
FIG. 14
FIG. 15

PROGRAMMABLE HORIZONTAL LINE FILTER IMPLEMENTED WITH SYNCHRONOUS VECTOR PROCESSOR

TECHNICAL FIELD OF THE INVENTION

The present invention is generally related to single instruction multiple data processors, and more particularly, to such a processor that is operable to implement a digital filter algorithm with the use of parallel processing elements.

CROSS REFERENCE TO RELATED APPLICATIONS

This application is related to U.S. Pat. No. 5,210,705, issued May 11, 1993 to G. Cheauvel, et al., which patent is incorporated herein by reference.

BACKGROUND OF THE INVENTION

Single-instruction, multiple-data (SIMD) processors are generally characterized as having an array of processors that perform the same operations simultaneously on each element of the data array. Vector processing, an application of SIMD processors, uses vector instructions, which specify the operation to be performed and specifies a list of operands, i.e., the data vector, on which it will operate.

Since the use of processor arrays can result in extensive parallelism, resulting in high execution speeds, one of the problems in the past has been getting data in and out of the processor during the processing operation. The solution to this has been to utilize a synchronous vector processor, which has been utilized in conjunction with digital television processors. The synchronous vector processors are utilized to form various processing tasks, such as filtering, for which a processor with a fast throughput is desirable. For example, digital comb filtering is utilized to separate the luminance and chrominance signals from each other. In general, digital filters are expressed as Z-transform functions, in which the terms represent weighted and timed delays.

One problem with existing digital filtering techniques is that calculations are typically performed with serial processing algorithms and devices, sample-by-sample and tap-by-tap. However, the newer filter applications require significantly more processing power than is available with these techniques. Some approaches to digital filtering have improved processing speed with custom design circuits. One of these is illustrated in U.S. Pat. No. 5,210,705.

SUMMARY OF THE INVENTION

The present invention disclosed and claimed herein comprises a digital processing system for implementing a digital filter. The digital processing system includes a plurality of parallel processing elements for receiving input data samples and constants in an ordered sequence, with an arithmetic logic unit associated with each of the processing elements. The arithmetic logic unit is operable to perform calculations in accordance with a predetermined digital filter algorithm to provide at the output of each of the processing elements an output filter value. A data input register is operable to receive a sequence of input data samples to be filtered for use by the processing elements. The input data samples are arranged to represent taps of a multi-tap digital filter implemented with the digital filter algorithm. Filter coefficients associated with the digital filter algorithm are also input for use by the processing elements in calculating the associated output filter value. An interconnect network selectively inputs to the processing elements the ones of the data samples associated with the taps on the digital filter required to calculate the associated output filter value in accordance with the digital filter algorithm. Additionally, ones of the filter coefficients required to calculate the associated output filter value in accordance with the digital filter algorithm are also selected for input to the appropriate processing element. An instruction generator provides the instructions and commands to the processing elements necessary to calculate the associated output filter values utilizing the associated filter coefficients and the ones of the input data samples provided thereto by the interconnect network.

In another aspect of the present invention, an output data register is provided for receiving the outputs of all of the processing elements and outputting them as a serial stream of data samples at a first output sample rate. A decimator is provided for decimating select ones of the output filter data samples in the sequence of filtered data samples to decimate the filter output. In one embodiment, this is realized with the use of a line memory having a Write Enable input. The data from the output data register is serially input to the line memory, with the Write Enable line utilized to inhibit the input of serial data to the line memory when the decimated ones of the output filter data samples are presented to the input.

In yet another aspect of the present invention, the digital filter algorithm is an interpolation filter algorithm which is operable to intersperse zeroes between the input data samples to represent a portion of the taps of the multi-tap digital filter. Each of the processing elements is associated only with the ones of the taps in the multi-tap digital filter associated with input data samples. Therefore, the output filter values from the processing elements comprise a decimated output. This decimated output represents a decimation back to the sample rate of the input data samples. Additionally, a further level of decimation is performed on the output of the processing elements to reduce the number of outputs therefrom.

In a further aspect of the present invention, the sequence of input data samples comprise data samples from a horizontal line in a video display. An input data register is provided for receiving the data samples in a serial manner for storage thereof and providing them as outputs in a parallel manner to represent taps in a multi-tap filter. The parallel processing elements are operable to input the data in a parallel manner during the period between the end of one horizontal line and the beginning of the next horizontal line in the video display, and to input the data in a parallel manner during the period between the end of one horizontal line and the next horizontal line in the video display, and to perform the computations during the period between the end of one horizontal line and the next horizontal line in the video display. Additionally, the filter coefficients are input either during the time between the end of one horizontal line and the beginning of the next horizontal line, for each horizontal line, or input during the period between the end of the last horizontal line in the video display and the beginning of the first horizontal line in the next video display. These coefficients then utilized for all subsequent horizontal lines in the video display.

BRIEF DESCRIPTION OF THE DRAWINGS

For a more complete understanding of the present invention and the advantages thereof, reference is now made to the following description taken in conjunction with the accompanying Drawings in which:

FIG. 3 illustrates a block diagram of the prior art processing elements of the processor of FIG. 2;

FIG. 4 illustrates a timing diagram of the processor of FIG. 2;

FIGS. 12–14 illustrate diagrammatic views of the FIR filter implementation with the synchronous vector processor;

FIG. 15 illustrates the interconnection of the multiplication operations performed in the synchronous vector processor;

DETAILED DESCRIPTION OF THE INVENTION

Figure 1:
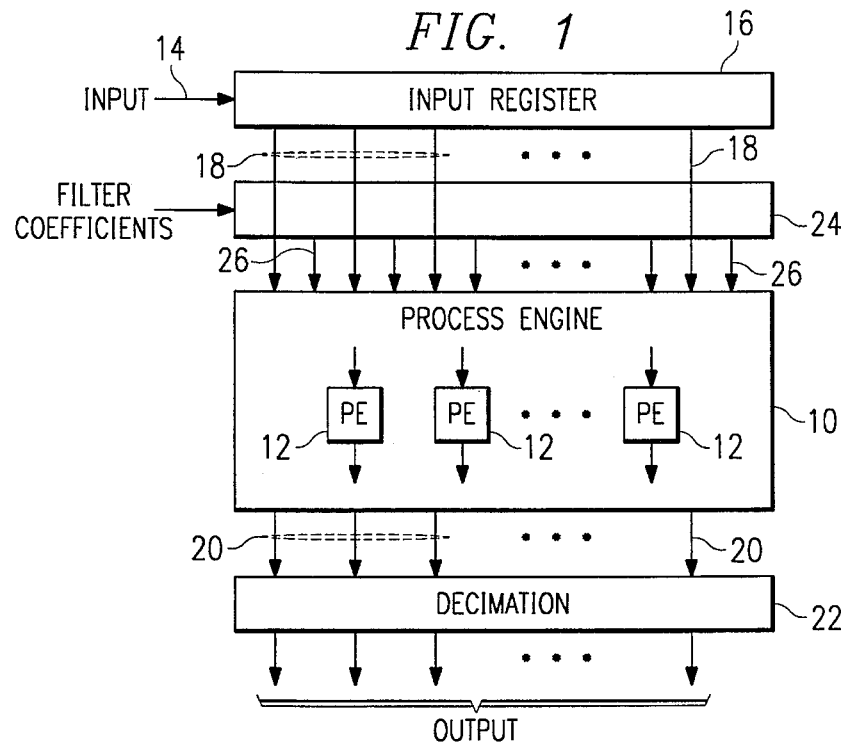
FIG. 1 illustrates a general block diagram of a synchronous vector processor configured as a decimation digital filter.

Referring now to FIG. 1, there is illustrated a block diagram of a multiprocessor implementation of a digital filter. A processing engine 10 is provided, having a plurality of parallel processing elements 12 associated therewith and labelled "PE". The processing elements 12 have associated therewith an input and an output, each of the inputs comprising a plurality of inputs which may be shared with adjacent ones of the processor elements, as will be described in more detail hereinbelow. An input signal is received on an input line 14 and comprises serial input data. The serial input data is input to an input register 16 which has a plurality of parallel outputs 18. The input register 16 therefore functions as a serial-to-parallel converter. As will be described in more detail hereinbelow, a packet of data is input to the input register 16 in a given process cycle and then loaded into the process engine 10 for processing thereof during a process cycle, the process cycle is continued until the next packet of input data from the input register 16 is loaded.

The processing engine 10, in the preferred embodiment, is operable to process the input data from the input register 16 through a digital filter algorithm and provide on a plurality of outputs 20 a filter output. The filter that is realized with the processing engine 10 is a Finite Impulse Response (FIR) filter. Part of the decimation process is the use of a decimation device 22, which is operable to arrange the data in an appropriate order, as will be described in more detail hereinbelow. In order to process the FIR filter algorithm, FIR filter coefficients are required, which are input to a FIR filter register 24 as a serial data stream, which serial data stream is received from an external memory, such as a ROM, and then output as a parallel word to the process engine on outputs 26. It should be noted that the entire filter algorithm is carried out by the processing engine 10 in its process cycle, with each of the processing elements 12 operating simultaneously and in parallel.

Figure 2:
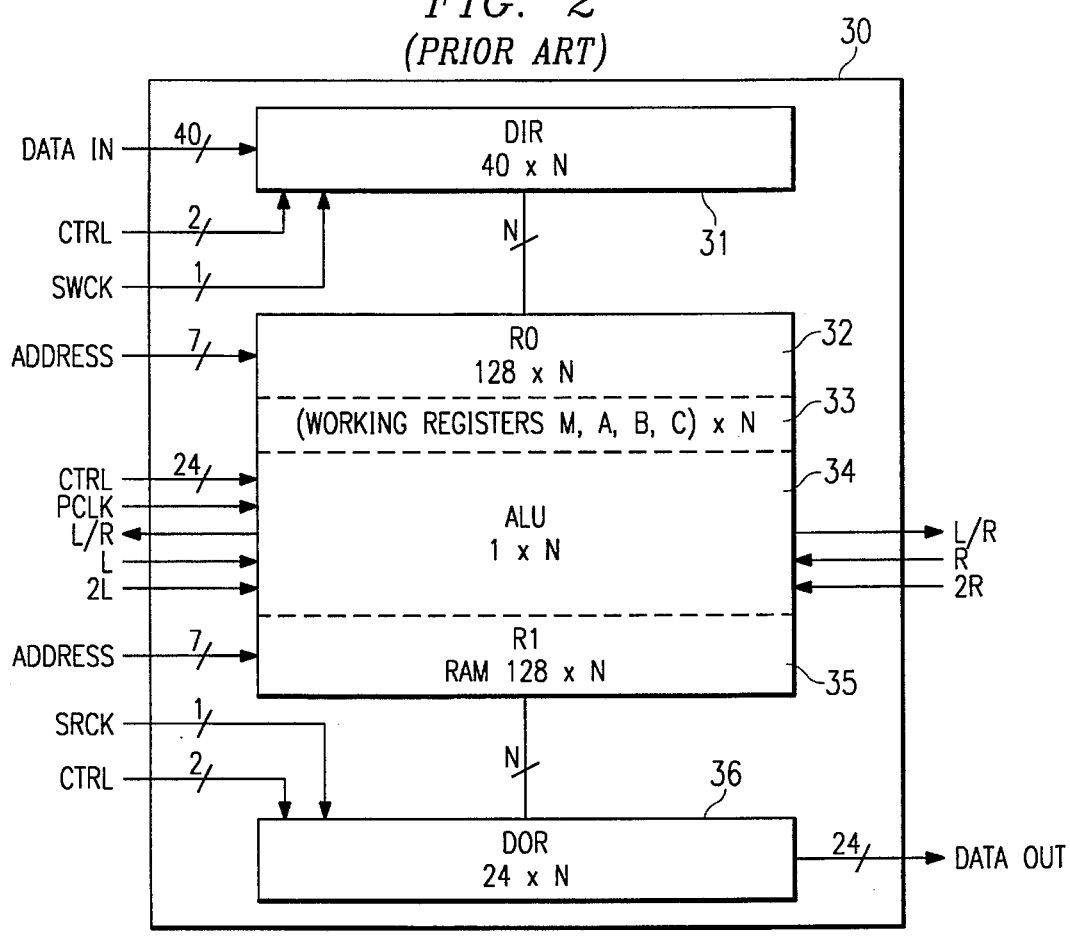
FIG. 2 illustrates a block diagram of a representative prior art single instruction multiple-data processor.

Referring now to FIG. 2, there is illustrated a block diagram of a prior art synchronous vector processor (SVP) 30. The SVP 30 is described in U.S. Pat. No. 5,210,705, which is incorporated herein by reference. The "serial video" aspects of the SVP 30 derive from the fact that it is particularly suited for video processing, where discrete packets of incoming data, which have a uniform size, are input and output in a word-serial manner, but are processed in parallel. The "synchronous vector" aspects of the SVP 30 derive from the fact that it receives and processes data vectors in synchronization with a real time data source. Essentially, the SVP 30 operates by using fine-grain parallelism techniques in which many processing elements operate on the data concurrently.

The SVP 30 is a general-purpose single-instruction, multiple-data (SIMD), reduced instruction set computing (RISC) device. Consistent with the SIMD characteristics, the SVP 30 has a plurality of processing elements (PEs), which execute the same instruction at the same time. External microinstructions control primitive logic and arithmetic functions for each clock cycle.

The SVP 30 is a one-dimensional array of one-bit PEs 40. A block diagram of a single PE 40 is illustrated in FIG. 3. Each PE 40 has the following basic components: a data input register (DIR) 31, two independently addressed register files (R0 and R1) 32 and 35, and a set of working registers (WRs) 33, a one-bit arithmetic unit (ALU) 34 and a data output register (DOR) 36. These are described briefly herein; however, the related patents provide further descriptions, especially with regard to instructions and timing.

The DIR 31 can be thought of as the "input layer", with R0 32 and R1 35, the WRs 33 and the ALU 34 being the "computational layer". The DOR 36 constitutes the "output layer". Although each layer may be independently clocked across each layer, all PEs 40 operate in unison; that is, every clock cycle. The input to the DIR 31 is word-serial in the sense that words of an incoming packet of data are received into the DIR 31 word by word. Similarly, the output from the DOR 36 is word-serial. Although the input and the output are word-serial, processing of each data packet is performed in parallel. Also, due to the "layered" approach to processing, data input, computation, and data output may become concurrent operations, with each being independently clocked. Each PE 40 performs these operations on an entire vector of data at once, and is thus a "pipeline" operation that enables several operations to be performed in various stages at once. When a packet of data is input into DIR 31 (the input layer), previous input data is computed by the computational layer, and previous computed data is output from DOR 36 (the output layer). Input and output are in synchronization with the data source, such as a video camera, and with the data sink, such as raster scan delay.

For illustrative purposes, the SVP 30 has N number of PEs where N=1440. The memory size is 256 bits for each PE 40, with 128 bits each for R0 and R1, with DIR 31 being 40 bits wide and DOR 36 being 24 bits wide. These sizes are discretionary, it being understood that the sizes may be changed. The input and output bit sizes are included in FIGS. 2 and 3 to illustrate various input/output device size relationships. However, these bit sizes may be varied according to the application.

With the above values, a single SVP 30 comprises data packets of up to 1440 words by 40 bits. Typically, the packets are equal in size and represent periodically recurring data, such as lines of a television image, where each packet is digitized into N number of data samples and where for each sample, Y(i), i=1 . . . N, is a data word used to generate an output word. In television applications, where the SVP 30 has N PEs, N also represents the number of data samples per line.

FIG. 3 illustrates a single prior art PE 40 (i) and its associated data components, where i=1 . . . 1440. A vertical slice through the SVP 30 of FIG. 2 yields an individual PE 40(i) of FIG. 3; thus, address, each PE 40(i) and its components are referred to herein as a "column" with respect to the entire array of PEs 40(i).

The DIR 31 and the DOR 36 are the basic I/O devices of the SVP 30. Both the DIR 31 and the DOR 36 are arrays of sequentially addressed, dual-ported memory cells. As used in this description, "DIR 31" refers to the entire array and "DIR (i)" refers to the column of DIRs 31 that receive data samples Y(i).

Referring further to FIGS. 2 and 3, the input array size to the SVP 30 connoted by the DIR 31 is 1440 words×40 bits. One port of the DIR 31 is organized as 1440 words of 40 bits each and permits the DIR 31 to be written into from a 40 bit input line in parallel. Thus, this first port of the DIR 31 emulates the Write port of a 1440-word line memory, which permits word-serial input. The second port of the DIR 31 is organized as 40 words of 1440 bits each, where each bit corresponds to a PE 40(i). This second port provides an interface between the DIR 31 and the PEs 40(i). It is physically a part of, and is mapped into, the absolute address space of R0 32. This permits the contents of the DIR 31 to be addressed for selection to Write into memory and is Read in parallel.

The DOR 36 is a two port device, similar to the DIR 31. In a manner similar to the DIR 31, it provides 1-bit access to each ALU 34(i) and 24-bit output from the SVP 40. One port of the DOR 36 is 1440 words of 24 bits each. This port functionally emulates the Read port of a 1440-word line memory and is used for word-serial output. The second port of the DOR 36 is organized of 24 words of 1440 bits each, where each bit corresponds to a PE 40(i). The second port couples to R1 35, and is written to in parallel.

The Write and Read control signals to the DIR 31 and DOR 36 operate such that the DIR 31 and DOR 36 each have a 1440-bit word selection commutator, which controls loading to and reading from the DIR 31 and the DOR 36, each having an enable and a reset signal. The data inputs to the DIR 31 are controlled by the signals Write Enable (WE), Reset Write (RSTW) and Serial Write Clock (SWCK). WE controls both the Write functions and the address pointer increment functions synchronously with SWCK, which is the data sample clock input. When high, RSTW resets the address pointer to the first word in the DIR 31 on the next rising edge of SWCK. The control signals for DOR 36 and Read Enable (RE), Reset Read and Read Enable (RSTR) and Serial Read Clock (SRCK), which operate in an analogous manner.

R0 32 and R1 35 each have 128 words by bit of Read/Write memory per PE 40. Different addressing structures cover the R0 32 and R1 35. However, R0 32 and R1 35 show the same control and timing circuitry. R0 32 and R1 35 are comprised of Random Access Memory (RAM) cells. If dynamic RAM cells are used, they must be refreshed, but typical digital television applications perform the refresh by operating in a faster cycle time than the required refresh period.

Each R0 32(i) and R1 35(i) is independently addressable and is capable of a one-bit Read-modify-Write cycle such that it can be read, the data operated on by the ALU 34, and the result written back to it in a single clock cycle. R0 32 and R1 35 read data at the same time.

The Working Register (WR) set 33(i) for each PE 40(i) comprises four registers: M, A, B and C. These registers are the same, except for their data sources and destinations. Each WR 33(i) is associated with an input multiplexer for providing data to the four inputs of each ALU 14(i). The M register is used for division, multiplication and logical and conditional operations. Registers A, B and C are addend, minuend and carry/borrow registers, respectively.

The ALU 34 is a simple full adder/subtracter and a one-bit multiplier. The inputs to the ALU 34 are received from the WRs 33. These ALUs 34 carry out whatever instruction is specified by the control unit of the SVP 30. One feature of the SVP 30 is that each ALU 34 executes instructions from a set of instructions that operate on data directly. A control unit, which feeds an instruction string to the SVP 30, has an additional set of instructions that provide basic execution control.

Referring now to FIG. 4, there is illustrated a timing diagram of a single cycle of the SVP 30. A Processing Clock (PCLK) is one of three clocks of the SVP 30, where each clock corresponds to an input, computational or output layer. Although the clocks are asynchronous to permit concurrent operations of these three layers, the input clocks stop to permit data transfers into and out of the computational layers.

In FIG. 4, one PCLK cycle, N, has a period T. The labeled timing points indicate interlocked edges, where NCGATE and PCGATE are control signals for sense amplifiers (not shown) and YSEL350/1 indicates a select signal for R0 32 or R1 35. The sense amplifiers amplify and control the BITLINES for R0 32 and R1 35 transfers. To achieve the single-cycle 1440-bit parallel computations, data transfers between R0 32, R1 35 and ALU 34 are precisely timed. Each such data transfer is held off by a computation interlock circuit until the end of computation is indicated. This technique achieves a fast memory/processor data transfer rate.

Figure 5:
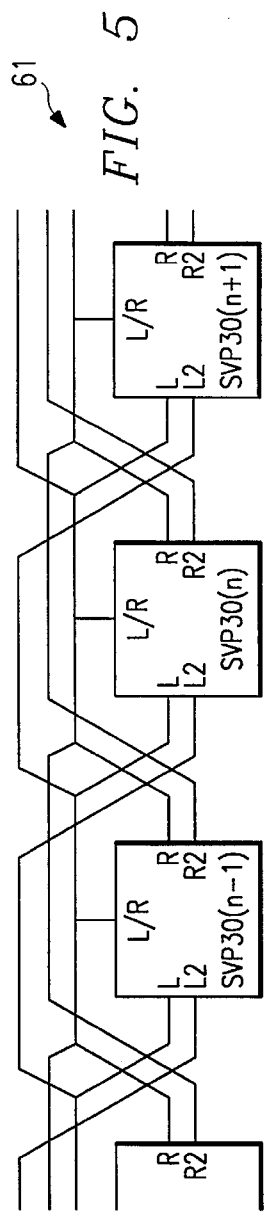
FIG. 5 illustrates prior art near-neighbor communications among processing elements of the processor of FIG. 2.

Referring now to FIG. 5, there is illustrated one example of the prior art near neighbor communications among PEs 40. A Left/Right (L/R) bus 61 provides direct memory and registers Read/Write from each PE 40 to the four nearest neighbor PEs 40, i.e., the two PEs 40 to the left and the two PEs 40 to the right, although any number of adjacent PEs could be interconnected. To accomplish such communication, each PE 40 generates one output, which is fanned out to its four neighbor PEs 40. This output may be from any one of four sources: a logic "0", the contents of the B register of WR 33 or a location from either R0 32 or R1 35. However, in the exemplary embodiment, only the primary input value is needed for transfer across PEs. Each PE 40 also receives four signals, one from each of its four nearest neighbors. As will be described hereinbelow, the L/R communications are especially useful for multi-tap FIR filters, which can be factored into five or fewer taps.

As indicated above, the SVP 30 is especially useful for digital video processing. Each signal segment that represents a horizontal line of an incoming television signal is digitized as a data "packet" comprised of data samples. The SVP 30 loads, processes and outputs data for each pixel on a horizontal line in parallel. The architecture of the SVP 30 permits data vectors from multiple pixels, multiple lines or multiple fields to be processed in parallel, and hence the SVP 30 is capable of the "three-dimensional processing" required for digital television.

A particular advantage of using the SVP 30 is that discrete line memories are not required. Line-by-line storage is emulated in the processing of the SVP 30, using a software procedure, referred to as "global rotation". This procedure is explained in the above-cited U.S. patent application, Ser. No. 4,214,299.

Figure 6:
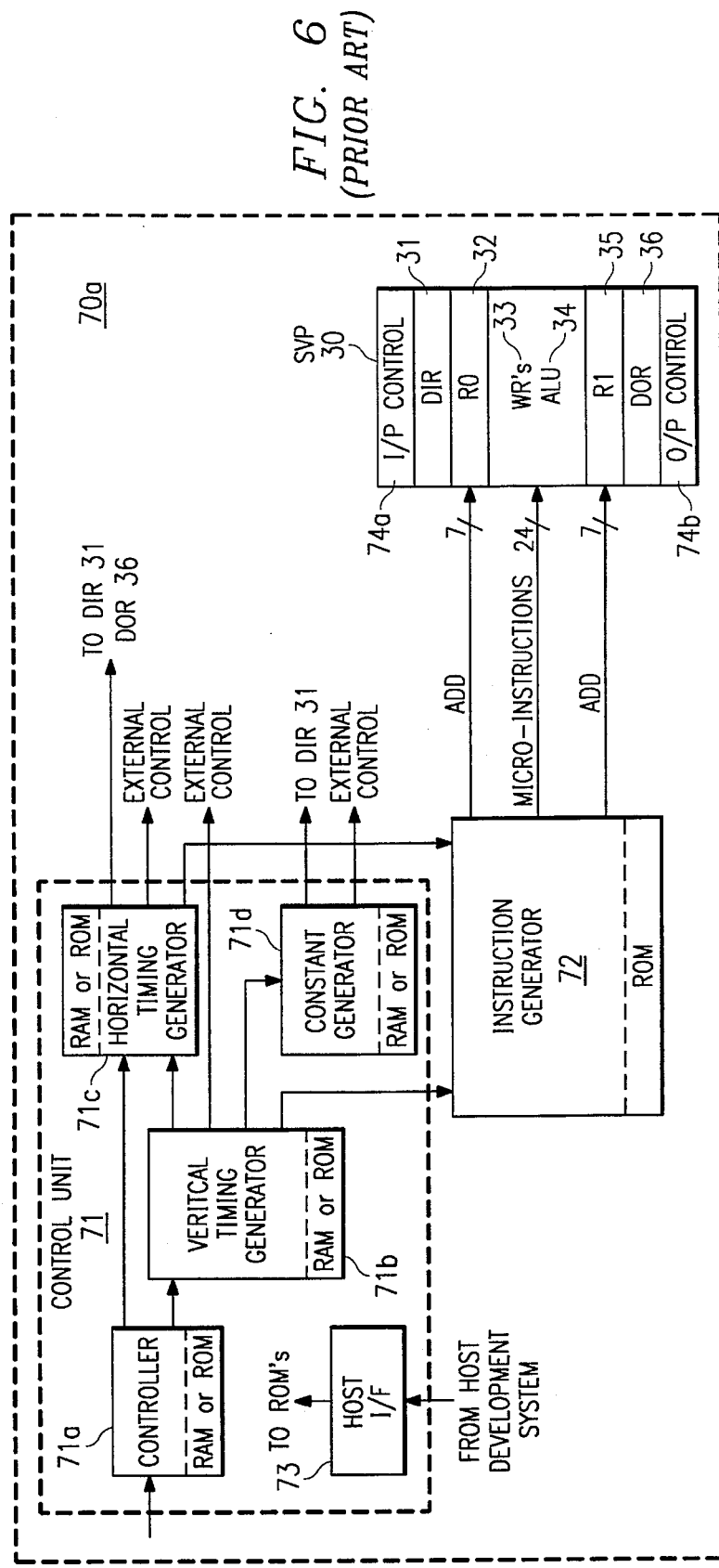
FIG. 6 illustrates a block diagram of a prior art digital processing unit that includes the processor of FIG. 2.
Figure 7:
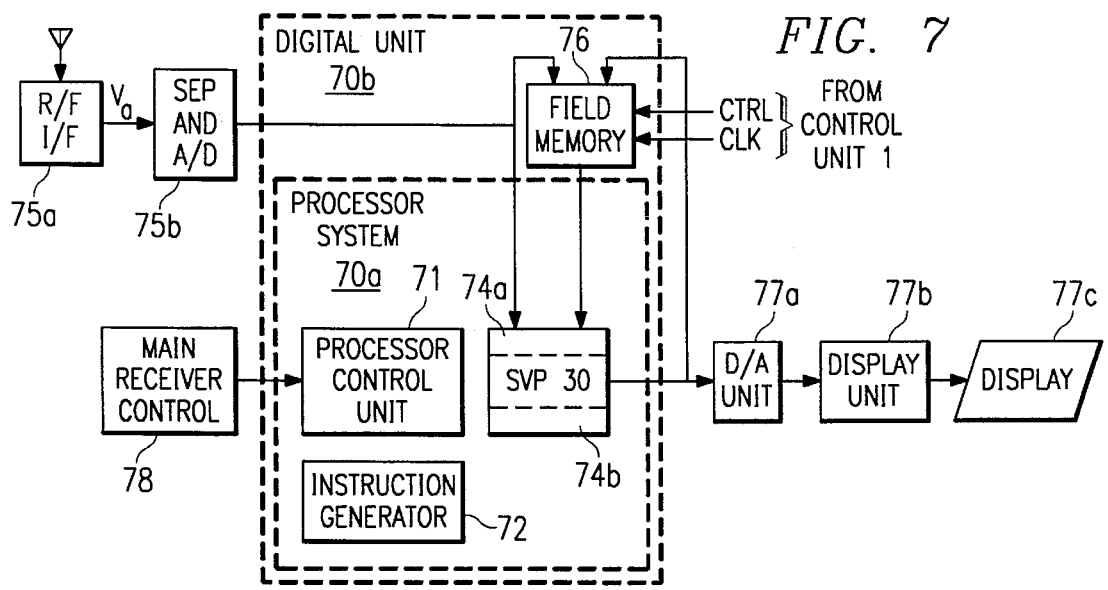
FIG. 7 illustrates a block diagram of a typical prior art television receiving system that includes the digital processing unit of FIG. 6.

Referring now to FIG. 6, there is illustrated a prior art basic processor system 70a, having a single SVP 30 associated therewith. The television receiver circuits surrounding processor system 70a is illustrated in FIG. 7, which also illustrates data inputs to the SVP 30. In contrast, FIG. 6 illustrates the control, address and instruction inputs to the SVP 30, and may be supplemented with the description of the same circuits in the above-cited U.S. patent application Ser. No. 421,299.

Referring further to FIG. 6, the basic components of the processor system 70a are the SVP 30 and the SVP control unit 71, and an instruction generator 72. The user of one SVP 30 versus more than one SVP 30 is dependent on the complexity of the processing tasks and depends on the execution time. For full screen real-time video processing, the operation is performed on a line of picture data that must be executed in a single 1H, where H represents the period of one horizontal scan line. However, if 1H is not enough time, more than one SVP 30 may be interconnected and processing tasks partitioned among them. Each SVP 30 need not have the exact configuration illustrated above with respect to FIGS. 2 and 3. As already stated, the distinguishing characteristics of an SVP 30 is the ability to process the data packet consisting of an entire line of television pictures in parallel, using a processing element for each pixel.

An input control unit 74a may perform more than one type of input control, depending on the types of tasks to be performed. For loading the DIR, the control circuits include a device for controlling the WE signal, which is triggered to begin at the end of a horizontal blanking period and clocked such that all columns of the DIR 31 are loaded during one horizontal scan period. Input control unit 74a also controls what type of data is received into the SVP 30. A particular type of input control, specially designed for high data input rate, is described in U.S. Pat. No. 5,210,705. An output control unit 74b may be configured using similar techniques.

The SVP control unit 71 has several components: controller 71a, vertical timing generator 71b, horizontal timing generator 71c and constant generator 71d. Ideally, each of these devices is programmable and accesses its own program store memory. In FIG. 6, each of these components has its own Random Access Memory (RAM) or Read Only Memory (ROM). To facilitate development of processing tasks, programs may be developed on a host system (not shown) and downloaded to each RAM, using standard interface techniques. A host interface 73 may provide for either parallel or serial data transfers, for example, a RS-232C interface. When the processing tasks are fixed, ROM is used for replacing RAM.

In operation, the SVP control unit 71 generates control signals for SVP 30, which are synchronized with the vertical synchronization signal and the horizontal synchronization signal of the incoming television transmission. These control signals include operating constants, instructions and timing signals. As an overall of the timing operation of SVP control unit 71, controller 71a controls the video signal processing at a field or frame rate, vertical timing generator 71b controls processing at a line rate and horizontal timing generator 71c controls processing at a pixel rate.

The SVP control unit 71 also provides timing and control signals to other system components, such as for horizontal and vertical synchronization. These latter timing signals are "external" in the sense that they do not control processor system 70a. Instead, they control devices such as field memories.

The SVP controller 71a receives and interprets external commands from a main television receiver control unit (illustrated in FIG. 7). It generates a series of control codes to vertical timing generator 71b and horizontal timing generators 71c. Controller 71a is programmable with a variety of instructions, including conditional and vectored jumps.

The vertical timing generator 71b provides control codes to horizontal timing generator 71c, constant generator 71d and instruction generator 72. It also provides timing to external circuits requiring a timing result of one horizontal line.

The horizontal timing generator 71c generates timing signals for circuits requiring timing edges at sample clock rates, such as the DIR 31, the DOR 36, field memories, and A/D and D/A converters (shown in FIG. 7 hereinbelow). It is capable of producing timing edges with a resolution as small as one sample clock.

Similarly, constant generator 71d provides constant values to individual PEs 40. There are two main reasons for using such constants. First, it is possible to map waveforms onto the PEs 40, Second, the constants distinguish the PEs from other PEs which have different constants to modify or switch algorithms in the horizontal direction, even if all of the PEs execute the same instructions in an SIMD manner. For example, the constants distinguish the PEs from other PEs which have different constants to modify or switch algorithms in the horizontal direction, even if all of the PEs execute the same instructions in an SIMD manner. For example, local constants distinguish the I chrominance signal from the Q signal and permit the PEs 40 to multiplex and demultiplex the chrominance signal and to modify algorithms in the horizontal direction when merging two images.

The instruction generator 72 receives algorithm specifier codes from vertical timing generator 71b and condition flags from horizontal timing generator 71c. It outputs microinstructions to the ALU 34, and addresses for R0 32 and R1 35. Additionally, instruction generator 72 provides the basic execution control instructions, such as for jumps, calls and returns, test flags and global rotations. Instruction generator 72 is associated with program storage such as a RAM or ROM, to which instructions may be downloaded from a host system (not shown), or to execute predetermined algorithms.

The various digital television processing tasks performed by processor system 70a may include scan conversion, motion detection, luminance and chrominance signal processing, and interpolation and decimation. Many of these tasks involve the use of filter algorithms to remove unwanted signal artifacts.

Referring specifically to FIG. 7, there is illustrated a block diagram of the basic components of a prior art television receiving system which includes processor system 70a. More specifically, a processor system 70a is part of a digital unit 70b, which also includes field memory 76. At the front end of the system, a video signal from an antenna or other source is detected in the usual manner through a standard RF/IF unit 75a, producing an analog video signal Va. Separation in analog-to-digital (A/D) unit 75b performs whatever demodulation or separation is required for the particular signal being utilized and converts the signal to digital sampled data. This data, in digital form, is referred to herein as the "signal" due to the fact that it represents a continuous incoming picture signal. Although word sizes and sampling rates may vary, for purposes of the examples herein, the sampling frequency is $4f_{sc}$ for luminance signals and $1f_{sc}$ for chrominance signals, where $f_{sc}$ is the color subcarrier frequency. For every pixel to be displayed, this conversion produces three parallel inputs to the DIR 31 of the SVP 30, a luminance sample and two chrominance samples. With a 40-bit DIR 31, each pixel value may be represented by a total of 40 bits. Typically, each sample is an 8-bit word, thus each pixel is derived from at least three 8-bit words.

The digital unit 70b has a processor system 70a and a field memory 76. Field memory 76 is simply a standard first in-first out memory for storing fields of video data. Field memory 76 is actually comprised of a number of field memories 76(i), which provide digital unit 70b with the field-delay data used for various processing tasks, especially temporal filtering. Each of these field memories 76(i) may be any one of a number of well-known devices, such as the TMS4C1060, manufactured by Texas Instruments, Inc. Field memory 76 may be a bank of DRAMs or, because random access is not necessary, may merely provide serial inputs and outputs. Depending on the algorithms performed by the ALU 34, the field memory 76 may be a part of the feedback path to the SVP 30, or it may simply provide pre-processing or post-processing storage.

The main receiver control unit 78 receives external signals such as those from a keypad, remote control or video decoder. This decodes the signals and transmits them to other receiver components, such as the SVP control unit 71.

From digital unit 70b, the processed video data signal is output in parallel, as 8-bit words to D/A unit 77a. Thus, digital unit 70b is simply interposed in the signal path at the output of a conventional television receiver RF/IF unit 75a. The display unit 77b is a standard unit for converting the processed signals into red, green and blue signals. This is accomplished by the usual matrix techniques.

The display 77c receives the analog video signal from the display unit 77b. Typically, display 77c is of a raster scan type, such as a cathode ray tube. However, the invention could be utilized with any type of display having appropriate adapter circuits to use the signal generated by the SVP 30. For example, the display 77c could be utilized with a display memory (not shown) that receives the signal from processor system 70a and outputs all pixel elements in parallel.

Figure 8:
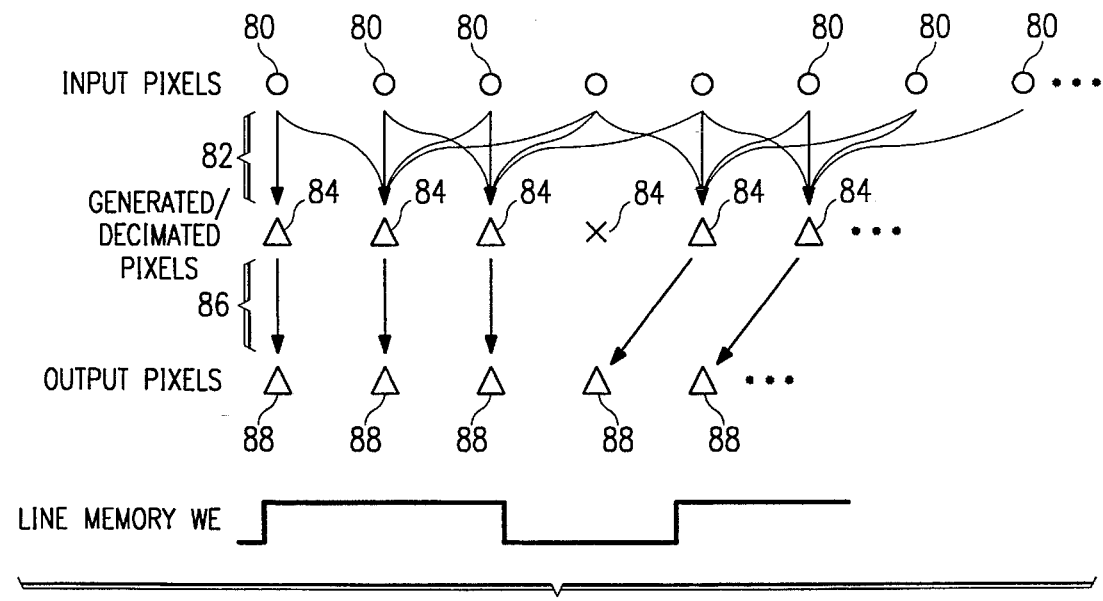
FIG. 8 illustrates a diagrammatic view of the implementation of the processing operation to realize a decimation digital filter.

Referring now to FIG. 8, there is illustrated a diagrammatic view of the overall processing operation for a filter implementation by the SVP 30. The input pixels are illustrated by a first layer of pixels 80, represented by small disc-shaped elements. These are input to a processing layer 82 that is operable to utilize a process element for each pixel 80 and provide on the output thereof an output pixel 84. The output pixels 84 are of two types, a generated pixel and a decimated pixel. In the example illustrated in FIG. 8, a 4:3 aspect ratio picture on a 16:9 aspect ratio screen is provided for such that one pixel in every four is decimated. The generated pixels are represented by a triangle shape with the decimated pixels represented by a "x". These are selected in a decimation layer 86 to provide output pixels 88, which are selected by the decimation layer 86 to be only the generated pixels in the set of output pixels 84. This rearrangement operation of the layer 86 is performed by a line memory Write Enable (WE) timing signal which allows a Write to the line memory whenever one of the generated pixels is to be output and does not allow a Write whenever the decimated pixel is output.

The purpose for having the decimated pixels generated on the output of one of the processing elements is that the algorithm for a given generated output pixel will utilize multiple paths about a portion of the input pixels 80, with each of the processing elements having only a predetermined amount of "reach" about the center input pixel. To facilitate the algorithm with the physical layout of the processing elements, one out of every four processing elements is not used for the 4:3 decimation ratio.

Figure 9:
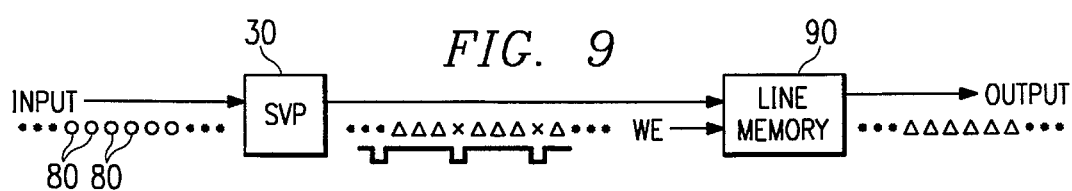
FIG. 9 illustrates a block diagram of the combination of the synchronous vector processor and line memory for performing the decimation process.

Referring now to FIG. 9, there is illustrated a diagrammatic view of the serial operation of the SVP 30, having an output thereof connected to the input of a line memory 90. The SVP receives on the input thereof the digitized serial stream of pixels 80 and generates on the output thereof the generated pixels and the decimated pixels, which are comprised of a series of groups, each group comprised of three adjacent generated pixels followed by a decimated pixel. It should be understood that a given line or "packet" of input pixels 80 are input to the SVP 30 and processed in an SIMD manner to provide the output pixels as a parallel word. The output pixels, after generation thereof, are then output in a serial manner to provide the output of the SVP 30. These are serially input to the line memory 90 and loaded therein by a Write Enable signal which, as described above, is operable to inhibit writing whenever the decimated pixel is output by the SVP 30. This provides the rearrangement of the string of pixels with the output of line memory 90 then providing a serial output. The serial output will again represent a line or "packet" which is shorter than the length of the line or "packet" in the input pixels 80.

Figure 10:
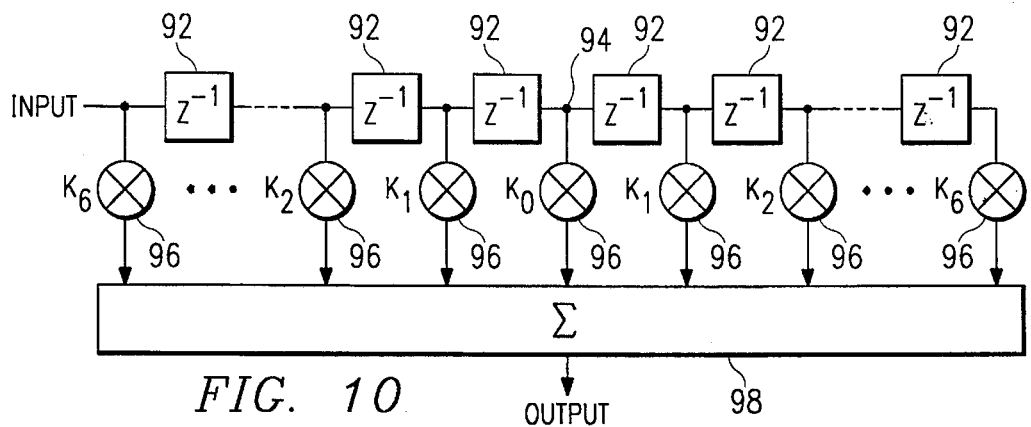
FIG. 10 illustrates a diagrammatic view of a prior art delay-type FIR filter implementation.

Referring now to FIG. 10, there is illustrated a diagrammatic view of a prior art FIR filter implementation utilizing delays. The FIR filter illustrated in the exemplary embodiment is a 13-tap symmetrical FIR filter which provides for 13 taps and a maximum of seven filter coefficients $K_0$–$K_6$. A plurality of delay blocks 92 are provided, disposed between each of the taps with a separate tap represented by a tap 94, each of the taps input to a multiplication block 96 with each of the multiplication blocks 96 operable to multiply the value at the tap by the associated FIR filter coefficient. The FIR filter coefficient associated with the filter tap 94 is $K_0$, with the FIR filter coefficients extending in either direction from the center tap 94, increasing from $K_1$–$K_6$ on either side of the tap 94.

The output of multiplication blocks 96 are input to an accumulation or summation block 98 for summation thereof.

After summation, the information is clocked through the delay lines such that, for each cycle of the clock, a multiplication is performed, followed by an addition. This is done through a single accumulation cycle where the input data is multiplied by different ones of the coefficients, summed by accumulation blocks 98, and then, at the other accumulation cycle, providing an output. The disadvantage of prior art systems is that they require the presence of multiple multiplications followed by multiple additions.

Figure 11:
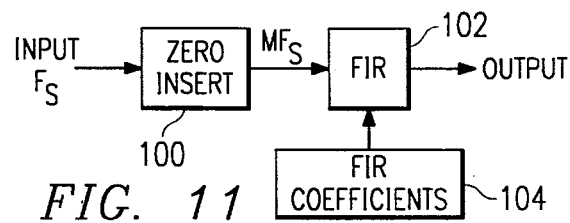
FIG. 11 illustrates a block diagram of the FIR filter.

Referring now to FIG. 11, there is illustrated a block diagram of a general FIR filter implementation. The input is typically provided to a zero insert block 100 to increase the sampling frequency thereof from an input sampling frequency $f_s$ to a sampling frequency of $Mf_s$ by interspersing zeroes between each sample. This is then input to a Finite Impulse Response (FIR) filter block 102, which is an interpolation filter that fills in the data, this filter implementing a conventional FIR filter algorithm. The FIR filter algorithm is defined by the FIR coefficients, which are stored in a block 104. Depending upon the number of taps, which is defined by the architecture of the FIR filter block 102, the coefficients need only be input to the multiplication blocks of the appropriate multipliers in association with the appropriate taps in the multi-tap filter design.

Figure 12:
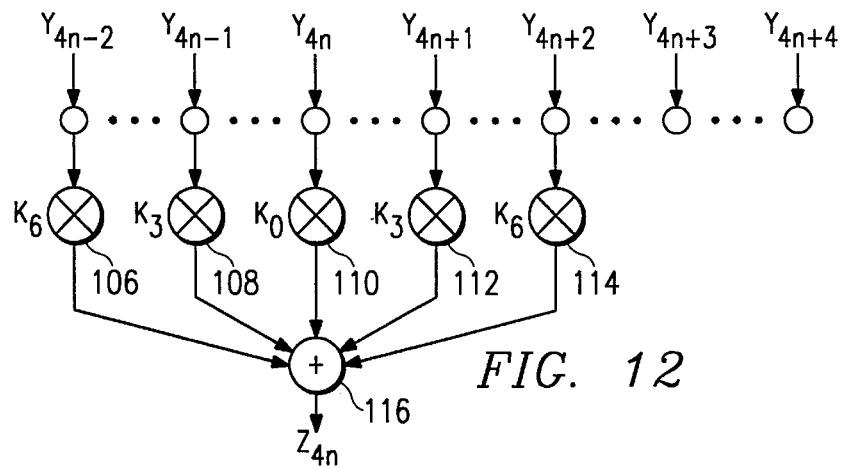
Figure 13:
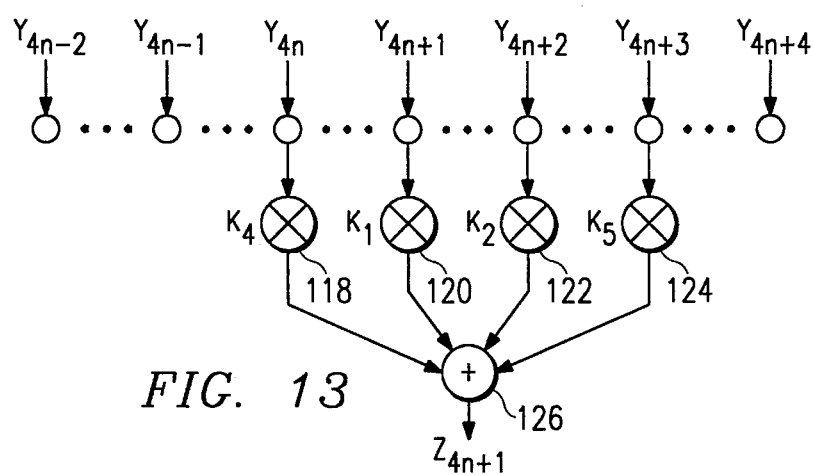

Referring now to FIGS. 12–14, there are illustrated the process interconnections showing the multiplications and additions for three sequential outputs from the process engine 10, illustrating outputs $Z_{4n}$, $Z_{4n+1}$ and $Z_{4n+2}$. For reference purposes, the digitized pixel inputs are represented about a center pixel $Y_{4n}$ extending on one side to $Y_{4n+4}$ and on the other side to $Y_{4n-2}$. Each of the pixel pairs has two "zeroes" interspersed therebetween to increase the sampling frequency to $Mf_s$, the sampling frequency increased by a factor of 3×.

In the example illustrated, a 13-tap FIR low pass filter is realized. The insertion of the two zeroes triples the sampling frequency before the 13-tap filter is applied. The filter algorithm will therefore be required to filter out these zeros and thus serve as an interpolation filter. However, there is only one PE output for every three possible filter outputs. As such, by limiting the outputs to one third of the total number of outputs, the output is automatically decimated by a factor of three. When performing the 13-tap filter algorithm, multiplications between the FIR filter coefficients and the zero-value, which is inserted between the sample points, can be eliminated, since the value will be zero. Therefore, it is only necessary to perform calculations for the filter output associated with the PE output, thus reducing the processing time by two thirds. This will therefore provide a filter that receives a data input at a first sampling frequency, increase the sampling frequency by a factor of three, process the higher frequency data with a filter algorithm operating at the higher frequency and then decimate the output back to the original input data rate. Additional decimation is then applied to further reduce the number of filter outputs by not selecting the output of every fourth PE. Thus, the decimated pixel will not occupy processing time.

With specific reference to FIG. 12, the $Z_{4n}$ output operates in accordance with the following equation:

$$Z_{4n}=K_6 \cdot Y_{4n-2}+K_3 \cdot Y_{4n-1}+K_0 \cdot Y_{4n}+K_3 \cdot Y_{4n+1}+K_6 \cdot Y_{4n+2} \qquad (1)$$

This therefore only requires five input pixels to be operated on to provide the calculation for all thirteen taps associated with the $Z_{4n}$ output, this calculation performed completely in the associated PE. The input pixel $Y_{4n-2}$ is input to a multiplication block 106, which performs a multiplication with the constant $K_6$, whereas the input pixel $Y_{4n-1}$ is input to a multiplication block 108 for multiplication by the coefficient $K_3$, the input pixel $Y_{4n}$ is input to multiplication block 110 for multiplication by the coefficient $K_0$, the input pixel $Y_{4n+1}$ is input to multiplication block 112 for multiplication by the coefficient $K_3$ and the input pixel $Y_{4n+2}$ is input to a multiplication block 114 for multiplication by the coefficient $K_6$. Each of the multiplication blocks 106–114 are input to a summation block 116 to provide the output $Z_{4n}$.

With specific reference to FIG. 13, the output $Z_{4n+1}$ is calculated with only four inputs, the inputs $Y_{4n}$, $Y_{4n+1}$, $Y_{4n+2}$ and $Y_{4n+3}$. These inputs are input to effective multiplication blocks 118, 120, 122 and 124, for multiplication by respective coefficients $K_4$, $K_1$, $K_2$ and $K_5$. The output of each of the multiplication blocks 118–124 are input to a summation block 126 to provide on the output thereof the output $Z_{4n+1}$. This will result in the following operation:

$$Z_{4n+1}=K_4 \cdot Y_{4n}+K_1 \cdot Y_{4n+1}+K_2 \cdot Y_{4n+2}+K_5 \cdot Y_{4n+3} \qquad (2)$$

With specific reference to FIG. 14, there is illustrated the operation for calculating the output $Z_{4n+2}$. This utilizes the four input pixels $Y_{4n+1}$, $Y_{4n+2}$, $Y_{4n+3}$ and $Y_{4n+4}$. These four inputs are input to respective multiplication blocks 128, 130, 132 and 134 for multiplication by respective coefficients $K_5$, $K_2$, $K_1$ and $K_1$. Multiplication blocks 128–134 are input to a summation block 136 to provide on the output thereof the output $Z_{4n+2}$. This provides the following operation:

$$Z_{4n+2}=K_5 \cdot Y_{4n+1}+K_2 \cdot Y_{4n+2}+K_1 \cdot Y_{4n+3}+K_4 \cdot Y_{4n+4} \qquad (3)$$

It can be seen that in the SVP 30, the processing element $PE_{4n}$ calculates $Z_{4n}$, $PE_{4n+1}$ calculates $Z_{4n+1}$ and $PE_{4n+2}$ calculates $Z_{4n+2}$, with the output of $Z_{4n+3}$ decimated.

As an example of the 13-tap filter, the following FIR filter coefficients will provide a decimation filter calculation, These coefficients are as follows:

K0=1.0000

K1=0.7500

K2=0.3750

K3=0.0000

K4=0.0625

K5=0.0625

K6=0.0000

These coefficients can be applied to the decimation filter calculation in the SVP 30 in accordance with the above equations. This will result in the configuration illustrated in FIG. 15 for the inputs $Y_{4n-1}$, $Y_{4n}$, $Y_{4n+1}$ and $Y_{4n+2}$. It can be seen that the input $Y_{4n}$ is utilized in three calculations for the output $Z_{4n+2}$, $Z_{4n}$ and $Z_{4n+1}$. For the calculation $Z_{4n}$, $Y_{4n}$ is multiplied by the constant $K_0$ in multiplication block 110 and coefficient $K_4$ in multiplication block 118 for calculation of the outputs $Z_{4n+1}$. Additionally, $Y_{4n}$ is multiplied in a multiplication block 140 by the coefficient $K_4$ for use in calculation of the output $Z_{4n-2}$, which has a summation block 142 associated therewith. Similarly, the input pixel $Y_{4n+1}$ is utilized in two multiplications in multiplication blocks 120 and 128 for the calculations of the outputs $Z_{4n+1}$ and $Z_{4n+2}$. The input pixel $Y_{4n+2}$ is utilized in two multiplications in multiplication blocks 122 and 130 for use in the outputs $Z_{4n+1}$ and $Z_{4n30\ 2}$, respectively. Since the coefficients $K_3$ and $K_6$ are zero, a number of the multiplications can be done away with.

Figure 16:
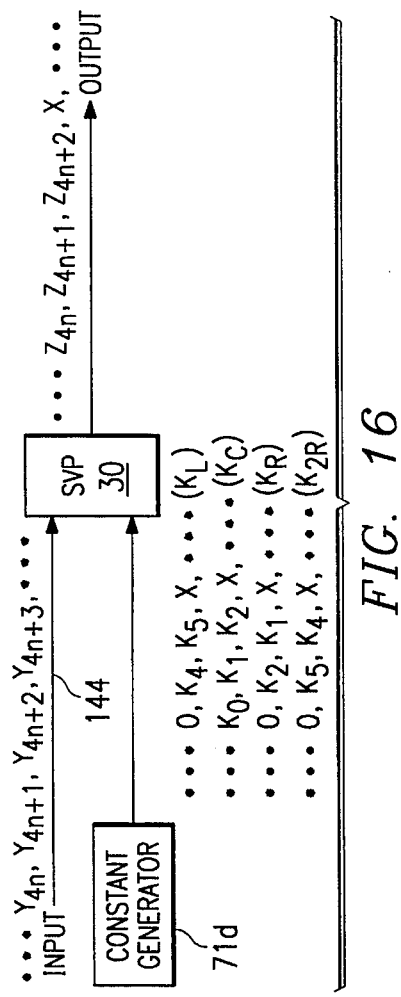
FIG. 16 illustrates a block diagram of the signal flow to the synchronous vector processor.

Referring now to FIG. 16, there is illustrated a block diagram of the decimation filter utilizing the SVP 30, illustrating the input as a sequence of input values $Y_{4n}$, $Y_{4n+1}$, $Y_{4n+2}$, $Y_{4n+3}$, ... on a line 144. Additional inputs to the SVP 30 are the constants which are received from the constant generator 71d. There are four types of constants that are stored, $K_L$, $K_C$, $K_R$, $K_{2R}$. $K_L$ is a series of coefficients which are multiplied with left-neighbor PE data ($Y_{i-1}$). $K_C$ is a series of coefficients which are multiplied with data in the associated PE ($Y_i$). $K_R$ and $K_{2R}$ are a series of coefficients which are multiplied with right and second right neighbor PE data ($Y_{i+1}$) and ($Y_{i+2}$). The relationship between the PE, input and coefficients is described in Table 1.

TABLE 1

| PE # | 4n−4 | 4n−3 | 4n−2 | 4n−1 | 4n | 4n+1 | 4n+2 | 4n+3 |
|---|---|---|---|---|---|---|---|---|
| Input | $Y_{4n-4}$ | $Y_{4n-3}$ | $Y_{4n-2}$ | $Y_{4n-1}$ | $Y_{4n}$ | $Y_{4n+1}$ | $Y_{4n+2}$ | $Y_{4n+3}$ |
| $K_L$ | 0 | $K_4$ | $K_5$ | x | 0 | $K_4$ | $K_5$ | x |
| $K_C$ | $K_0$ | $K_1$ | $K_2$ | x | $K_0$ | $K_1$ | $K_2$ | x |
| $K_R$ | 0 | $K_2$ | $K_1$ | x | 0 | $K_2$ | $K_1$ | x |
| $K_{2R}$ | 0 | $K_5$ | $K_4$ | x | 0 | $K_5$ | $K_4$ | x |
| Output | $Z_{4n-4}$ | $Z_{4n-3}$ | $Z_{4n-2}$ | $Z_{4n-1}$ | $Z_{4n}$ | $Z_{4n+1}$ | $Z_{4n+2}$ | $Z_{4n+3}$ |

The FIR coefficients are loaded from the constant generator 71d by a different number of methods. In one method, the coefficients are loaded into a register file (R0 or R1) 32 or 35 through the data input register (DIR) 31 during each horizontal blanking period. Thereafter, they can be utilized in the filter calculations. In the preferred method, the constant generator is comprised of a Read Only Memory (ROM) which generates the appropriate coefficients at the appropriate time. For example, during the first multiplication, it is only necessary to multiply the input data sample $Y_{i-1}$ by the coefficient $K_L$ in all of the processing elements. Therefore, it is then necessary to output only these coefficients for this calculation. The next multiplication will require that the input data sample $Y_i$ be multiplied by the coefficient $K_C$ for all of the processing elements, and so on, as described above with respect to Table 1. For each multiplication, it is only necessary to have the appropriate coefficient presented to the processing elements. If the ROM cannot address a sufficiently long enough word, then an intermediate register can be utilized.

In another method, a register file can be provided to load and store the coefficients during the vertical blanking period and then utilized for the next display scan and the calculations for all horizontal lines. A further method is to permanently program the coefficients as constants for each of the processing elements.

Figure 17:
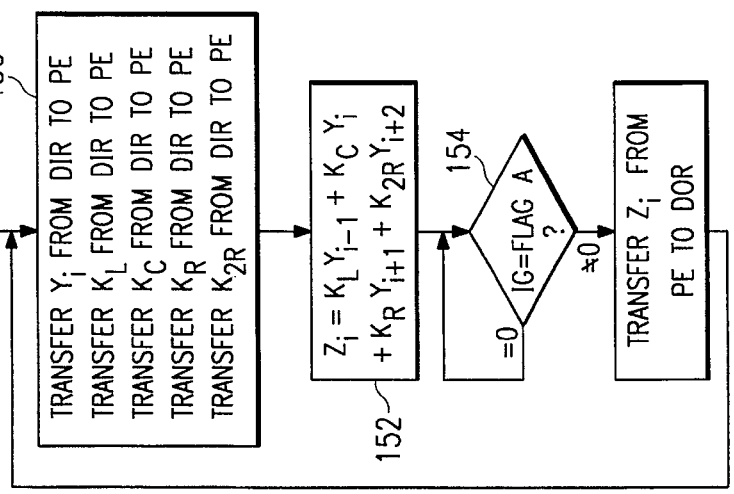
FIG. 17 illustrates a flowchart depicting the operation of each of the processing elements of the synchronous vector processor.

Referring now FIG. 17, there is illustrated a flowchart depicting the operation of the process element. Initially, all of the values of $Y_i$ and the coefficients are transferred to the DIR. Thereafter, the $Y_i$ and the coefficient values for the given PE are transferred from the DIR to the PE, as indicated by block 150. This data transfer is synchronized with the input signal, this synchronization effected by the HSYNC signal being connected to the instruction generator flag 72 in the SVP 30. The PE then performs the following calculation in a function block 152:

$$Z_i = K_L \cdot Y_{i-1} + K_c Y_i + K_R Y_{i+1} + K_{2R} Y_{i+2} \qquad (4)$$

It should be understood that the operation of the PE requires that an input value and corresponding coefficient are input and multiplied and stored in a working register prior to the next multiplication, such that the operation is a sequential one. It can therefore be seen that four sequential multiplications and three sequential additions must be performed during a horizontal period in order to calculate the value of $Z_i$ in a single PE, with no requirement for any interaction with adjacent PEs. The transfer of the value of $Z_i$ will not occur until the instruction generator flag is raised up from zero. As long as it is pulled to zero, the program will flow to a decision block 154 from the function block 152 and will loop back around to the input of decision block 154 until the beginning of the next horizontal blanking period. At the beginning of the next horizontal blanking period, the program will flow to a function block 156 to transfer $Z_i$ from the PE to the DOR. After transfer, the program will flow back to the input of the function block 150 for the next "packet" of data. Only the data transfer from PE-to-DOR and DIR-to-PE are required to be done during a horizontal blanking period, with other operations performed until the next horizontal blanking period. By carefully examining the coefficients, the number of calculations can be reduced in the PE.

The above example was illustrated assuming a 5-bit value for each of the coefficients. However, this can be easily expanded to a binary expression of the coefficients. The binary expression of the coefficients is illustrated in Table 2 as follows:

TABLE 2

| PE # (i) | $K_L$ | $K_C$ | $K_R$ | $K_{2R}$ |
|---|---|---|---|---|
| 4n | 0.0000 (0) | 1.0000 ($K_0$) | 0.0000 (0) | 0.0000 (0) |
| 4n+1 | −0.0001 ($K_4$) | 0.1100 ($K_1$) | 0.0110 ($K_2$) | −0.0001 ($K_5$) |
| 4n+2 | −0.0001 ($K_5$) | 0.0110 ($K_2$) | 0.1100 ($K_1$) | −0.0001 ($K_4$) |
| 4n+3 | x | x | x | x |

The same $Z_i$ calculation is performed with the 5-bit coefficients can be performed by introducing 4-bit constants ($B_1$–$B_4$) instead of four 5-bit constants ($K_L$, $K_C$, $K_R$, $K_{2R}$) as follows:

$$Z_i = B_i \cdot \frac{Y_i}{8} + B_2 \cdot \frac{Y_{i+1}}{8} + B_3 \cdot \frac{Y_i}{4} + B_3 \cdot \frac{Y_{i+1}}{4} + \qquad (5)$$

$$B_2 \cdot \frac{Y_i}{2} + B_1 \cdot \frac{Y_{i+1}}{2} + B_4 \cdot Y_i - \left( B_3 \cdot \frac{Y_{i-1}}{16} + B_3 \cdot \frac{Y_{i+2}}{16} \right)$$

The coefficients associated with the calculation of $Z_i$ with binary coefficients is illustrated in Table 3:

TABLE 3

| PE # (i) | $B_4$ | $B_3$ | $B_2$ | $B_1$ |
|---|---|---|---|---|
| 4n | 1 | 0 | 0 | 0 |
| 4n+1 | 0 | 1 | 1 | 0 |
| 4n+2 | 0 | 1 | 0 | 1 |
| 4n+3 | x | x | x | x |

In the SVP 30 program, division by 2, 4, 8 or 16 is achieved by shifting the address of a value such that it does not consume instructions. This is determined at the assembly time of the program and not at execution time. The following list is an example program that is executed by the SVP 30 to calculate $Z_i$ using the binary coefficients. A 1-bit architecture PE for the SVP 30 is suitable to perform this algorithm. List 1 illustrates the program and List 2 illustrates the macro and definition of the macro instructions utilized in List 1:

LIST 1

| ANDKL011 | Z-4, | Y, | B3, | 8 | |
| KAD2R011 | Z-4, | Y, | B3, | 8, | 8 |
| MOV10 | X-3, | Z-3, | 8 | | |
| ANDK011 | Z-3, | Y, | B1, | 8 | |
| KADR011 | Z-3, | Y, | B2, | 8, | 8 |
| KAD011 | Z-2, | Y | B1, | 7, | 8 |
| KADR011 | Z-2, | Y | B3, | 9, | 8 |
| KAD011 | Z-1, | Y, | B2, | 9, | 8 |
| KADR011 | Z-1, | Y, | B1, | 10, | 8 |
| KAD011 | Z, | Y, | B4, | 9, | 8 |
| SUB011 | Z-3, | X-3, | 12, | 8 | |

LIST 2

A is the LSB address of m-bit value in RF0.
B is the LSB address of n-bit value in RF1.
F is the address of 1-bit flag in RF1.
p is the maximum value of m and n, max (m,n).

| MOV10 | B,A,m | ;R1[B ... B + m − 1] | <−R0[A ... A + m − 1] |
| SUB001 | A,B,m,n | ;R0[A ... A + p] | <−R0[A ... A + m − 1] − R1[B ... B + n − 1] |
| ANDK011 | A,B,F,m | ;R0[A ... A + m − 1] | <−R1[B ... B + m − 1], if R1[F] = "1" |
| | | | <−"0 ... 0" (m bit), if R1 [F] = "0" |
| ANDKL011 | A,B,F,m | ;R0[A ... A + m − 1] | <−LR1 {B ... B + m − 1], if R1 [F] = "1" |
| | | | <−"0 ... 0" (m bit), if R1 [F] = "0" |
| KAD011 | A,B,F,m,n | ;R0[A ... A + p] | <−R0[A ... A + m − 1] + R1[B ... B + n − 1], if R1[F] = "1" |
| | | | <−R0[A ... A + m − 1], if R1[F] = "0" |
| KADR011 | A,B,F,m,n | ;R0[A ... A + p] | <−R0 [A ... A + m − 1] + RR1 [B ... B + n − 1], if R1[F] = "1" |
| | | | <−R0[A ... A + m − 1], if R1[F] = "0" |
| KAD2R011 | A,B,F,m,n | ;R0[A ... A + p] | <−R0[A ... A + m − 1] + R2R1 [B ... B + n − 1], if R1[F] = "1" |
| | | | <−R0[A ... A + m − 1], if R1 [F] = "0" |

Figure 18:
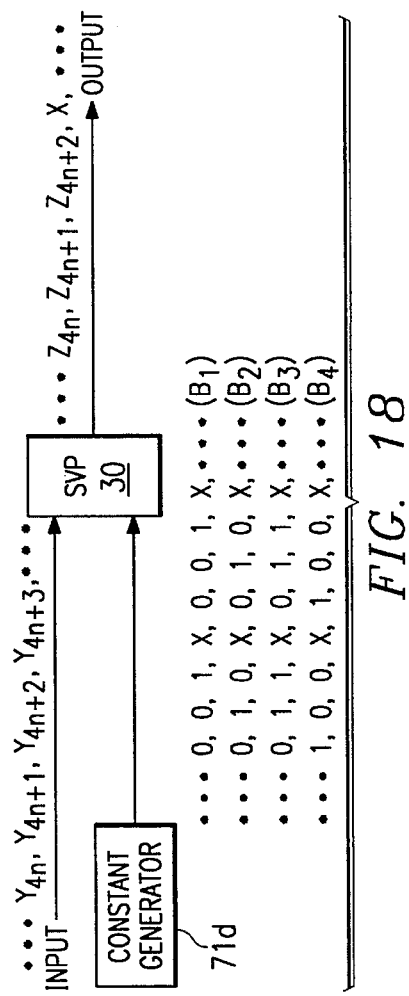
FIG. 18 illustrates an alternate embodiment of the system of FIG. 16 utilizing binary coefficients.

Referring now to FIG. 18, there is illustrated a block diagram depicting the operation of the binary coefficients. The block diagram of FIG. 18 is similar to the block diagram of FIG. 16. The constant generator 71d can be multiplexed with the video input ($Y_i$) and can be entered into the SVP 30 during the vertical blanking period of the input video signal.

The general horizontal-decimation filter can be realized with various decimation ratios. The decimation ratio is determined only by the constants from the constant generator and the Write Enable signal timing. The SVP program in general does not have to be changed. However, the architecture must account for a different number of tasks. By way of example, three decimation ratios can be calculated, 8:7, 6:5 and 4:3. These filters require 29-tap, 21-tap and 13-tap FIR filters, respectively. The coefficients utilizing the 5-bit coefficients $K_L$, $K_C$, $K_R$ and $K_{2R}$, are illustrated in Tables 4a, 4b and 4c for the ratios 8:7, 6:5 and 4:3, respectively. For the binary coefficients, Tables 5a, 5b and 5c illustrate the binary coefficients associated with the PEs. In Tables 4a–4c and 5a–5c, $K_L = K_{2R} = -0.000B_h$, $K_C = B_a.B_bB_cB_d0$ and $K_R = 0.B_eB_fB_g0$.

TABLE 4A

| PE # | $K_L$ | $K_C$ | $K_R$ | $K_{2R}$ |
|---|---|---|---|---|
| 8n | −0.0000 | 1.0000 | 0.0000 | −0.0000 |
| 8n+1 | −0.0000 | 0.1110 | 0.0010 | −0.0000 |
| 8n+2 | −0.0001 | 0.1100 | 0.0110 | −0.0001 |
| 8n+3 | −0.0001 | 0.1010 | 0.1000 | −0.0001 |
| 8n+4 | −0.0001 | 0.1000 | 0.1010 | −0.0001 |
| 8n+5 | −0.0001 | 0.0110 | 0.1100 | −0.0001 |
| 8n+6 | −0.0000 | 0.0010 | 0.1110 | −0.0000 |
| 8n+7 | x | x | x | x |

TABLE 4B

| PE # | $K_L$ | $K_C$ | $K_R$ | $K_{2R}$ |
|---|---|---|---|---|
| 6n | −0.0001 | 1.0000 | 0.0000 | −0.0000 |
| 6n+1 | −0.0001 | 0.1110 | 0.0100 | −0.0001 |
| 6n+2 | −0.0001 | 0.1010 | 0.1000 | −0.0001 |
| 6n+3 | −0.0001 | 0.1000 | 0.1010 | −0.0001 |
| 6n+4 | −0.0001 | 0.0100 | 0.1110 | −0.0001 |
| 6n+5 | x | x | x | x |

TABLE 4C

| PE # | $K_L$ | $K_C$ | $K_R$ | $K_{2R}$ |
|---|---|---|---|---|
| 4n   | −0.0000 | 1.0000 | 0.0000 | −0.0000 |
| 4n+1 | −0.0001 | 0.1100 | 0.0110 | −0.0001 |
| 4n+2 | −0.0001 | 0.0110 | 0.1100 | −0.0001 |
| 4n+3 | x | x | x | x |

TABLE 5A

| PE # | Ba | Bb | Bc | Bd | Be | Bf | Bg | Bh |
|---|---|---|---|---|---|---|---|---|
| 8n   | 1 | 0 | 0 | 0 | 0 | 0 | 0 | 0 |
| 8n+1 | 0 | 1 | 1 | 1 | 0 | 0 | 1 | 0 |
| 8n+2 | 0 | 1 | 1 | 0 | 0 | 1 | 1 | 1 |
| 8n+3 | 0 | 1 | 0 | 1 | 1 | 0 | 0 | 1 |
| 8n+4 | 0 | 1 | 0 | 0 | 1 | 0 | 0 | 1 |
| 8n+5 | 0 | 0 | 1 | 1 | 1 | 1 | 0 | 1 |
| 8n+6 | 0 | 0 | 0 | 1 | 1 | 1 | 1 | 0 |
| 8n+7 | x | x | x | x | X | x | x | x |

TABLE 5B

| PE # | Ba | Bb | Bc | Bd | Be | Bf | Bg | Bh |
|---|---|---|---|---|---|---|---|---|
| 6n   | 1 | 0 | 0 | 0 | 0 | 0 | 0 | 0 |
| 6n+1 | 0 | 1 | 1 | 1 | 0 | 1 | 0 | 1 |
| 6n+2 | 0 | 1 | 0 | 1 | 1 | 0 | 0 | 1 |
| 6n+3 | 0 | 1 | 0 | 0 | 1 | 0 | 1 | 1 |
| 6n+4 | 0 | 0 | 1 | 0 | 1 | 1 | 1 | 1 |
| 6n+5 | x | x | x | x | x | x | x | x |

TABLE 5B

| PE # | Ba | Bb | Bc | Bd | Be | Bf | Bg | Bh |
|---|---|---|---|---|---|---|---|---|
| 4n   | 1 | 0 | 0 | 0 | 0 | 0 | 0 | 0 |
| 4n+1 | 0 | 1 | 1 | 0 | 0 | 1 | 1 | 1 |
| 4n+2 | 0 | 0 | 1 | 1 | 1 | 1 | 0 | 1 |
| 4n+3 | x | x | x | x | x | x | x | x |

The SVP program for the above example is illustrated in List 3 as follows:

LIST 3

| (8:7) | (6:5) | (4:3) |
|---|---|---|
| $K_0 = 16/16 = 1.0000b$ | $K_0 = 16/16 = 1.0000b$ | $K_0 = 16/16 = 1.0000b$ |
| $K_1 = 14/16 = 0.1110b$ | $K_1 = 14/16 = 0.1110b$ | $K_1 = 12/16 = 0.1100b$ |
| $K_2 = 12/16 = 0.1100b$ | $K_2 = 10/16 = 0.1010b$ | $K_2 = 6/16 = 0.0110b$ |
| $K_3 = 10/16 = 0.1010b$ | $K_3 = 8/16 = 0.1000b$ | $K_3 = 0$ |
| $K_4 = 8/16 = 0.1000b$ | $K_4 = 4/16 = 0.0100$ | $K_4 = -1/16 = -0.0001b$ |
| $K_5 = 6/16 = 0.0110b$ | $K_5 = 0$ | $K_5 = -1/16 = -0.0001b$ |
| $K_6 = 2/16 = 0.0010b$ | $K_6 = -1/16 = -0.0001b$ | $K_6 = 0$ |
| $K_7 = 0$ | $K_7 = -1/16 = -0.0001b$ | |
| $K_8 = 0$ | $K_8 = -1/16 = -0.0001b$ | |
| $K_9 = -1/16 = -0.0001b$ | $K_9 = -1/16 = -0.0001b$ | |
| $K_{10} = -1/16 = -0.0001b$ | $K_{10} = 0$ | |
| $K_{11} = -1/16 = -0.0001b$ | | |
| $K_{12} = -1/16 = -0.0001b$ | | |
| $K_{13} = 0$ | | |
| $K_{14} = 0$ | | |

Figure 19:
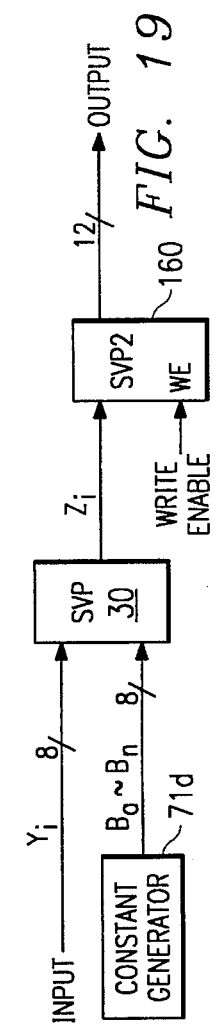
FIG. 19 illustrates a block diagram for the above-described horizontal line filter and a second SVP utilized for the line memory operation.
Figure 20A:
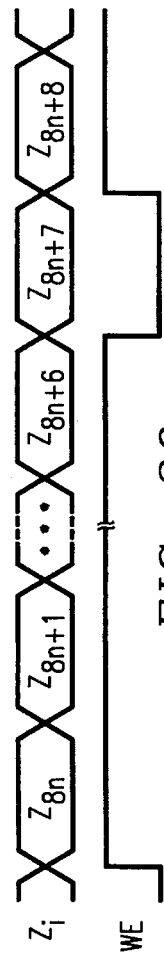
FIGS. 20a, 20b and 20c illustrate timing diagrams for various decimation ratios.
Figure 20B:
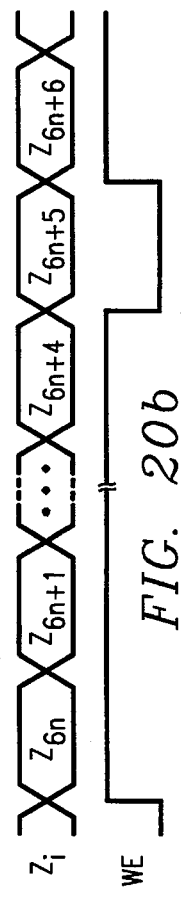
Figure 20C:
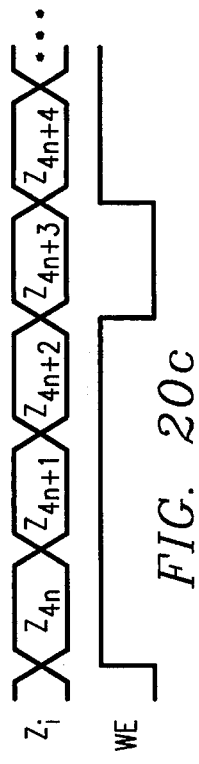

Referring now to FIG. 19, there is illustrated block diagram for the above-described horizontal decimation filter wherein a second SVP 160 is utilized for the line memory operation. The timing diagrams are illustrated in FIGS. 20a, 20b and 20c, for the decimation ratios 8:7, 6:5 and 4:3, respectively.

As a further illustration of how the SVP 30 can be utilized to calculate simultaneous operations utilizing nearest neighbor interconnection, a color matrix calculation is provided which converts from multiplexed R, G and B signals to Y, R-Y and B-Y. This is illustrated as follows:

$$\begin{bmatrix} Y \\ R-Y \\ B-Y \end{bmatrix} = \begin{bmatrix} 0.30 & 0.59 & 0.11 \\ 0.70 & -0.59 & -0.11 \\ -0.30 & -0.59 & 0.89 \end{bmatrix} \begin{bmatrix} R \\ G \\ B \end{bmatrix} \quad (6)$$

Figure 21:
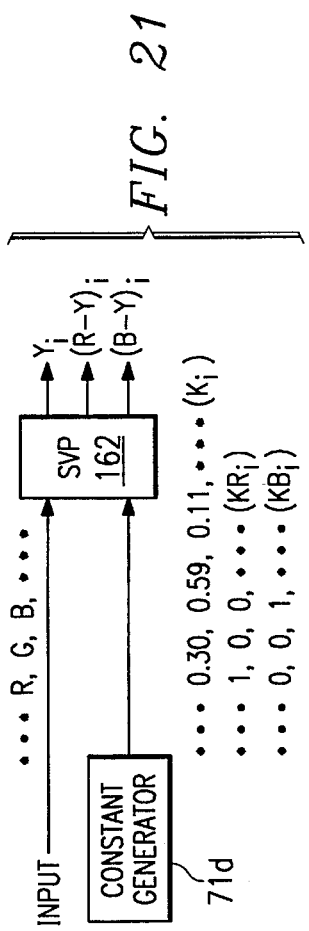
FIG. 21 illustrates a block diagram of the filter utilizing binary coefficients.

A block diagram of this example is illustrated in FIG. 21, wherein the input RGB signal in input in a serial manner to an SVP 162 and the constant generator provides three rows of constants, $K_i$, $KR_i$ and $KB_i$ as inputs thereto. The SVP 162 provides three outputs, $Y_i$, $(R-Y)_i$, $(B-Y)_i$. $KR_i$ and $KB_i$ are 1-bit constants to distinguish the R or B signals in the multiplexed RGB signal. $K_i$ is a series of constants for the matrix calculations.

Figure 22:
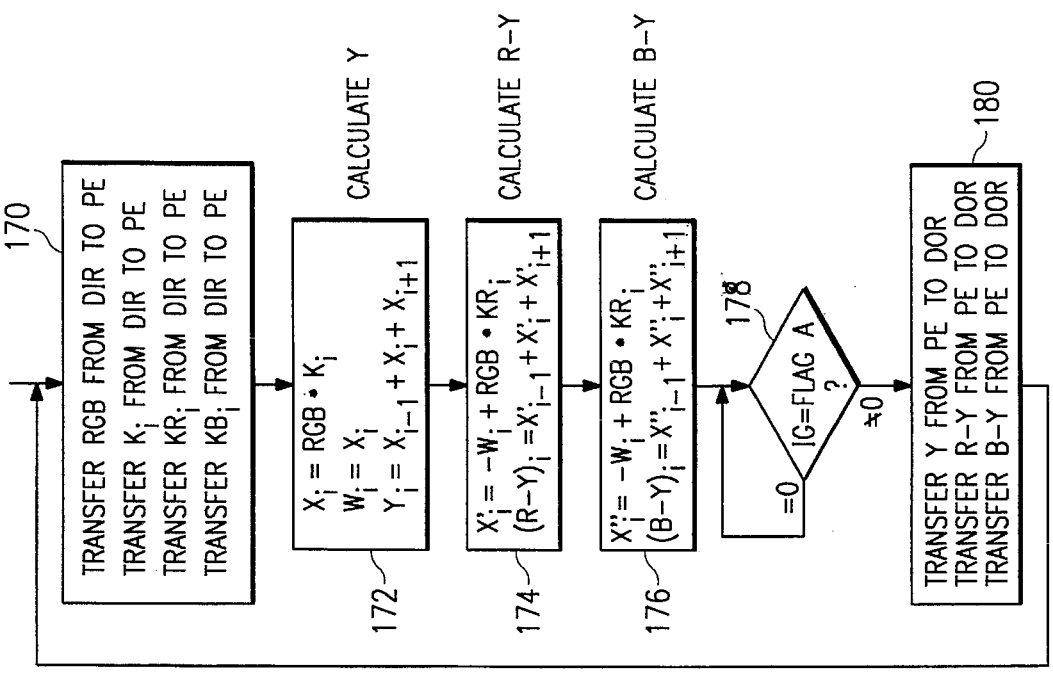
FIG. 22 illustrates a flowchart depicting the operation of each of the processing elements.

Referring now to FIG. 22, there is illustrated a flowchart depicting the operation of each of the processing elements. Initially, the RGB input signals and the constants are transferred from the DIR to the PE, as illustrated by the function block 170. The next process step is to calculate the value of Y. This is performed by doing the matrix calculation for $Y_i$. The program then flows to a function block 174 to calculate the value of (R-Y)$_i$ with the matrix calculation. This is followed by a function block 176 to calculate the value of B-Y. After calculation, the program flows to a decision block 178 to wait for the horizontal sync signal. When received, the program then flows to a function block 180 to transfer the values of Y, R-Y and B-Y from the PE to the DOR. The overall operation is illustrated in Table 6.

TABLE 6

| PE # (i) | 3n−1 | 3n | 3n+1 | 3n+2 | 3n+3 |
|---|---|---|---|---|---|
| RGB | $B_{n-1}$ | $R_n$ | $G_n$ | $B_n$ | $R_{n+1}$ |
| $K_i$ | 0.11 | 0.30 | 0.59 | 0.11 | 0.30 |
| Yi | $0.59\ G_{n-1}$ | $0.11\ B_{n-1}$ | $0.30\ R_n$ | $0.59\ G_n$ | $0.11\ B_n$ |
|  | $+0.11\ B_{n-1}$ | $+0.30\ R_n$ | $+0.59\ G_n$ | $+0.11\ B_n$ | $+0.30\ R_{n+1}$ |
|  | $+0.30\ R_n$ | $+0.59\ G_n$ | $+0.11\ B_n$ | $+0.30\ R_{n+1}$ | $+0.59\ G_{n+1}$ |
| KRi | 0 | 1 | 0 | 0 | 1 |
| Xi″ | $-0.11\ B_{n-1}$ | $0.70\ R_n$ | $-0.59\ G_n$ | $-0.11\ B_n$ | $0.70\ R_{n+1}$ |
| (R − Y)i | $-0.59\ G_{n-1}$ | $-0.11\ B_{n-1}$ | $0.70\ R_n$ | $-0.59\ G_n$ | $-0.11\ B_n$ |
|  | $-0.11\ B_{n-1}$ | $+0.70\ R_n$ | $-0.59\ G_n$ | $-0.11\ B_n$ | $+0.70\ R_{n+1}$ |
|  | $+0.70\ R_n$ | $-0.59\ G_n$ | $-0.11\ B_n$ | $+0.70\ R_{n+1}$ | $-0.59\ G_{n+1}$ |
| KBi | 1 | 0 | 0 | 1 | 0 |
| x″i | $0.89\ B_{n-1}$ | $-0.30\ R_n$ | $-0.59\ G_n$ | $0.89\ B_n$ | $-0.30\ R_{n+1}$ |
| (B − Y)i | $-0.59\ G_{n-1}$ | $0.89\ B_{n-1}$ | $-0.30\ R_n$ | $-0.59\ G_n$ | $0.89\ B_n$ |
|  | $+0.89\ B_{n-1}$ | $-0.30\ R_n$ | $-0.59\ G_n$ | $+0.89\ B_n$ | $-0.30\ R_{n+1}$ |
|  | $-0.30\ R_n$ | $-0.59\ G_n$ | $+0.89\ B_n$ | $-0.30\ R_{n+1}$ | $-0.59\ G_{n+1}$ |

In summary, there has been provided a device for realizing a horizontal line filter utilizing a synchronous vector processor. With the use of a synchronous vector processor a plurality of parallel processing elements are provided, each of which is associated with one of the outputs of the filter. The filter implements a multi-tap interpolation filter, wherein each of the processing elements performs all necessary calculations associated with a given output. These calculations require filter coefficients which are stored in ROM and loaded into the processing elements during the calculation of the output. Decimation is then provided for by selectively decimating the outputs at periodic intervals in the output data stream. During processing, each of the processing elements is operable to receive an input pixel value and a plurality of filter coefficients associated with the calculations necessary to generate the output pixel value. During calculation, the pixel values from adjacent processing elements are utilized to realize the multi-tap FIR filter design. In the first step of processing, the input pixel values are loaded into the input register along with the filter coefficients. The input values are then loaded into the associated processing element followed by loading of the coefficients therein. Each of the desired coefficients is multiplied by the associated input pixel value and the accumulated value thereof determined. This accumulated value comprises the output value. In order to selectively decimate the outputs of select ones of the processing elements, a line memory is utilized wherein the Write Enable is inhibited when the undesirable data is output from the DOR of the synchronous vector processor.

Although the preferred embodiment has been described in detail, it should be understood that various changes, substitutions and alterations can be made therein without departing from the spirit and scope of the invention as defined by the appended claims.

What is claimed is:

1. A method for converting a sequence of input digital data samples into a sequence of output filtered digital data samples according to a predetermined multi-tap finite impulse response filter algorithm with a digital processing system consisting of a plurality of serially disposed single bit processing elements, comprising the steps of:

receiving said sequence of input digital data samples;

inserting zero digital data samples between each pair of sequential input digital data samples in said sequence of input digital data samples thereby forming a zero interspersed sequence of digital data samples;

supplying said zero interspersed sequence of digital data samples into a serial-in-parallel-out data buffer, each data sample of said zero interspersed sequence of digital data samples stored in a corresponding sequential storage location;

receiving a predetermined plurality of filter coefficients that are associated with the finite impulse response filter algorithm to a filter coefficient input;

supplying each input filter coefficient of said predetermined plurality of filter coefficients to each of said plurality of serially disposed single bit processing elements;

outputting said zero interspersed sequence of digital data samples from the serial-in-parallel-out data buffer;

supplying each of said zero interspersed sequence of data sampled outputs from said serial-in-parallel-out data buffer to a corresponding one of the plurality of single bit processing elements;

supplying to each of said plurality of single bit processing elements digital data samples of said zero interspersed sequence of digital data samples stored within a selected subset of a second left neighboring single bit processing element, a left neighboring single bit processing element, a right neighboring single bit processing and a second right neighboring processing element;

simultaneously processing said zero interspersed sequence of digital data samples and a corresponding one of each of said input filter coefficients with said plurality of serially disposed single bit parallel processing elements, each of said plurality of serially disposed single bit processing elements having an arithmetic logic unit associated therewith for performing computations in parallel in accordance with the predetermined finite impulse response filter algorithm to provide at the output of each of said plurality of serially disposed single bit processing elements output filtered digital data samples;

supplying from each of said plurality of single bit processing elements said output filtered digital data samples corresponding to each digital data sample of said zero interspersed sequence of digital data samples into a parallel-in-serial-out data buffer, each output filter value stored in a corresponding sequential storage location and;

sequentially outputting said output filtered digital data samples from the parallel-in-serial-out data buffer.

2. The method of claim 1, and further comprising the step of decimating select ones of the output filtered digital data samples in the sequence of output filtered digital data samples to provide a decimated filter output.

3. The method of claim 2, wherein the step of decimating comprises the steps of:

receiving said sequence of output filtered digital data samples in a line memory that operates at substantially the first output sample rate; and inhibiting the input of serial data to the line memory when the decimated ones of the output filtered digital data samples are output from the parallel-in-serial-out data buffer and are presented for input to the line memory, such that they are effectively removed from the portion of the output filtered digital data samples stored in the parallel-in-serial-out data buffer.

4. The method of claim 1, wherein the sequence of input data samples comprise data samples from a horizontal line in a video display, and further comprising the steps of receiving the sequence of input data samples and storing them in an input data register in a serial manner and providing the data samples on the output of the input data register as parallel outputs for use in the step of processing.

5. The method of claim 4, wherein the step of processing with said plurality of serially disposed single bit processing elements comprises processing during the period between the end of one horizontal line and the end of the next horizontal line in the video display.

6. The method of claim 5, and further comprising the step of storing the filter coefficients in a filter coefficient register within each of said serially disposed single bit processing elements when the filter coefficients are input to the filter coefficient input and prior to use in the step of processing.

7. The method of claim 6, wherein the step of inputting the filter coefficients to the filter coefficient register occurs only during the period after the end of the last of the horizontal lines in the video display and the beginning of the first horizontal line in the next video display.

8. The method of claim 4, wherein the step of inputting the filter coefficients comprises inputting the filter coefficients only during the period between the end of one horizontal line and the beginning of the next horizontal line in the video display.

* * * * *